United States Patent [19]
Corisis

[11] Patent Number: 5,982,654
[45] Date of Patent: Nov. 9, 1999

[54] SYSTEM FOR CONNECTING SEMICONDUCTOR DEVICES

[75] Inventor: David J. Corisis, Meridian, Id.

[73] Assignee: Micron Technology, Inc., Boise, Id.

[21] Appl. No.: 09/118,894

[22] Filed: Jul. 20, 1998

[51] Int. Cl.⁶ ................................................. G11C 5/06
[52] U.S. Cl. ...................... 365/63; 365/189.08; 365/212
[58] Field of Search ............................... 365/52, 63, 176, 365/189.08, 208, 212

[56] References Cited

U.S. PATENT DOCUMENTS

| | | | |
|---|---|---|---|
| 4,992,850 | 2/1991 | Corbett et al. | 357/72 |
| 5,140,405 | 8/1992 | King et al. | 357/367 |
| 5,523,135 | 4/1996 | Dell et al. | 365/52 |
| 5,687,109 | 11/1997 | Protigal et al. | 365/63 |
| 5,729,049 | 3/1998 | Corisis et al. | 257/666 |
| 5,790,447 | 8/1998 | Laudon et al. | 365/52 |

*Primary Examiner*—David Nelms
*Assistant Examiner*—Thong Le
*Attorney, Agent, or Firm*—Dickstein Sharpiro Morin & Oshinsky, LLP

[57] ABSTRACT

A system of semiconductor devices is formed by staggering like devices on opposite sides of a board, such that common leads on the opposed devices are aligned. The common leads are connected directly through the board. The staggered arrangement provides additional room for conductive lines on the board. In addition, it improves performance by reducing signal delays. The invention is applicable to a dual in-line memory module and other products formed of semiconductor devices.

20 Claims, 1 Drawing Sheet

SYSTEM FOR CONNECTING SEMICONDUCTOR DEVICES

BACKGROUND OF THE INVENTION

1. Field of the Invention

The present invention relates generally to a system for providing electrical connections between semiconductor devices. The invention also relates to a method of making board mounted semiconductor devices. More particularly, the invention relates to an improved system for mounting memory devices in a dual in-line memory module (DIMM).

2. Discussion of the Related Art

Memory modules are known in the art. Such modules are shown, for example, in U.S. Pat. Nos. 5,687,109 (Protigal et al.) and 5,140,405 (King et al.). Conventional memory modules have memory chips mounted on a printed circuit board, an edge connector for connecting the module to a computer mother board, and conductive traces for connecting the chips to the edge connector. Since the board has a limited area, the system of traces can become congested. There is a need in the art for a routing system that provides the desired electrical connections with reduced congestion.

SUMMARY OF THE INVENTION

The disadvantages of the prior art are overcome to a great extent by staggering semiconductor devices on opposite sides of a supporting member, such as a printed circuit board. Thus, the present invention relates to a system in which first semiconductor devices are located on a first side of a supporting member, and second semiconductor devices are located on the opposite side of the supporting member. The second semiconductor devices are staggered between the first semiconductor devices. In addition, the second semiconductor devices are electrically connected to the first semiconductor devices, preferably directly through the supporting member.

The present invention also relates to a board mounted memory module having a board member, an edge connector, memory devices located on top of the board member, and second memory devices located on the bottom side of the board member. The second memory devices may be located between the first memory devices. Corresponding leads on the top and bottom devices may be aligned with each other and connected through the board to reduce routing congestion.

The devices may be connected by conductive pins extending through the board. Alternatively, the devices may have leads that extend entirely through the board, and the ends of the leads may be connected by solder on the surface of the board. In a third embodiment of the invention, the devices have ball grid arrays (BGA) or fine ball grid arrays (FBGA). In the third embodiment, solder balls at common positions may be connected to each other by conductive material penetrating through the board.

The invention is applicable to a dual in-line memory module that has an edge connector connected to the mounted memory devices (semiconductor chips) by conductive traces. The semiconductor devices employed in the present invention may be dynamic random access memory devices, static random access memory devices, read only memory devices, or other memory devices. The invention should not be limited, however, to memory systems. The invention may be applied to other integrated circuit devices.

The present invention also relates to a method of making a dual in-line memory module. Such modules have limited area for leads and conductive traces. The present invention makes efficient use of the available space by connecting common leads (or package pins) directly through the board.

With the present invention, by staggering like semiconductor devices on the top and bottom sides of a board, like leads can be aligned from top to bottom with minimal routing. The staggered arrangement reduces conductive line lengths. In addition, it improves product performance by reducing signal delays.

The present invention may also reduce the cost of manufacturing a dual in-line memory module by reducing the routing congestion which would otherwise require the use of minimum lines and spaces.

Another advantage of the invention is that routing congestion can be reduced without using mirror-image semiconductor devices. With the present invention, all of the semiconductor devices may be identical to each other, which facilitates assembly and testing.

These and other features and advantages of the invention will become apparent from the following detailed description of preferred embodiments of the invention.

DETAILED DESCRIPTION OF PREFERRED EMBODIMENTS

Figure 1:
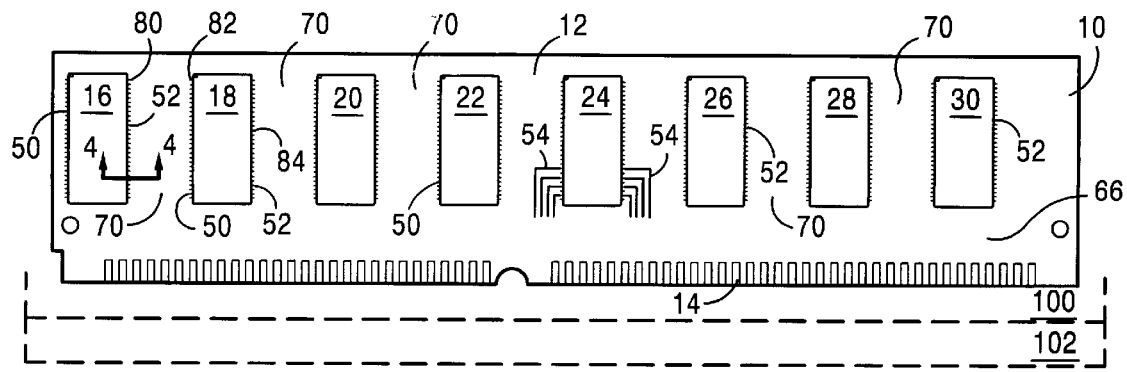
FIG. 1 is a top view of a memory module connected to a computer mother board.
Figure 2:
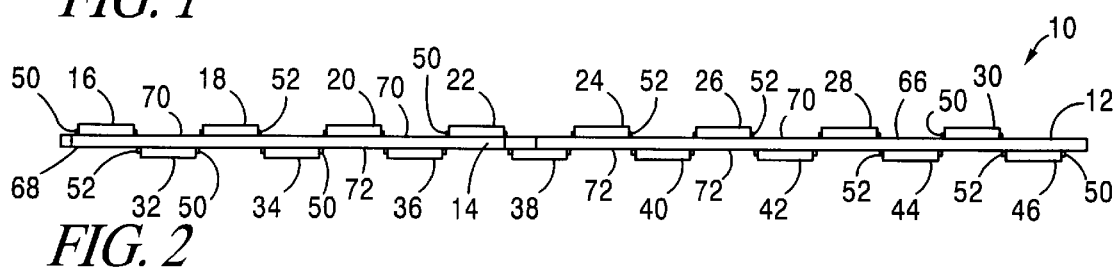
FIG. 2 is a side view of the memory module of FIG. 1.
Figure 3:
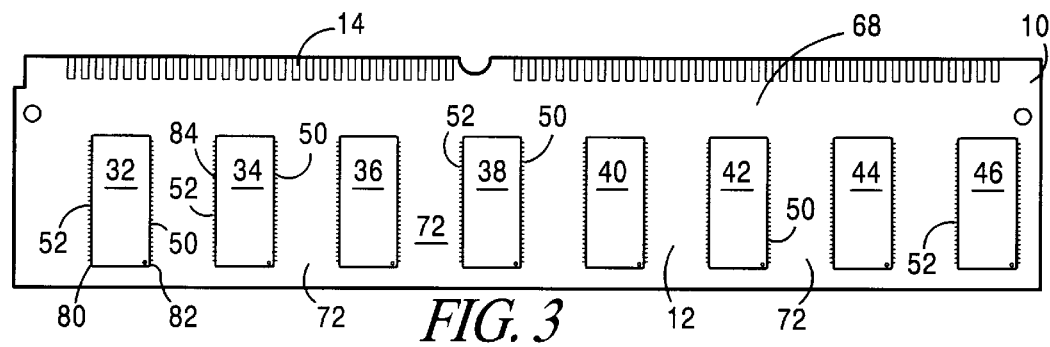
FIG. 3 is a bottom view of the memory module of FIG. 1.

Referring now to the drawings, where like reference numerals designate like elements, there is shown in FIGS. 1–3 a dual in-line memory module 10 constructed in accordance with the invention. The module 10 has a printed circuit board 12, an edge connector 14, and memory chips 16–46. The edge connector 14 plugs into a socket connector 100 on a computer mother board 102 for direct connection to the computer power and addressing buses. (For clarity of illustration, the connector 100 and the mother board 102 are shown schematically in FIG. 1.)

The memory chips 16–46 may all be substantially identical to each other. Each chip 16–46 has at least two sets of leads 50, 52. The leads 50, 52 are connected to the edge connector 14 by conductive traces 54. The traces 54 may be formed on the board 12 by photolithography and/or etching. (For clarity of illustration, only some of the traces 54 are shown in the drawings.)

The printed circuit board 12 has elongated top and bottom sides 66, 68. Eight chips 16–30 are attached to the top side 66. The other chips 32–46 are attached to the bottom side 68. To reduce the congestion of the traces 54, the chips 32–46 on the bottom side 68 are staggered between the chips 16–30 on the top side 66, as shown in FIG. 2. There is an open region 70 between each adjacent pair of chips 16–30 on the top side 66 of the board 12. The chips 32–44 on the bottom side 68 are located directly beneath the open regions 70. Likewise, there is an open region 72 between each adjacent pair of chips 32–46 on the bottom side 68. The chips 18–30 on the top side 66 are located directly above the open regions 72 on the bottom side 68.

Moreover, the chips 16–46 are supported on the board 12 such that the second leads 52 on the first chip 16 are substantially aligned with the second leads 52 on the ninth chip 32, the first leads 50 on the ninth chip 32 are aligned with the first leads 50 on the second chip 18, and the second leads 52 on the second chip 18 are aligned with the second leads 52 on the tenth chip 34, and so on as illustrated in FIG. 2.

Figure 4:
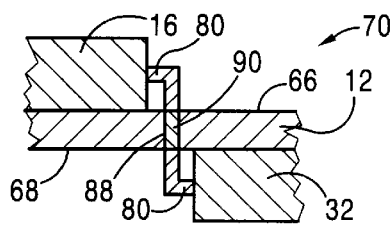
FIG. 4 is a partial cross section view of the memory module of FIG. 1, taken along the line 4—4.

The staggered alignment of the chips 16–46 makes it possible to connect a particular lead 80 on the first chip 16 directly through the board 12 to the same lead 80 on the ninth chip 32. The two leads 80 are vertically aligned with each other as shown in FIG. 4. No lateral routing is needed to connect the two like leads 80. Likewise, the staggered alignment makes it possible to connect another lead 82 (FIG. 3) on the ninth chip 32 directly to the same lead 82 on the second chip 18, and yet another lead 84 on the second chip 18 can be connected directly to the same lead 84 on the tenth chip 34 (with no lateral routing), and so forth. The staggered alignment reduces the amount of lateral routing connections that would otherwise be required to electrically connect like leads on the chips 16–46.

As shown in FIG. 4, an opening 88 may be formed in the printed circuit board 12 at the point where the like leads 80 are aligned. A conductive pin 90 may be formed in the opening 88 to provide electrical connection between the leads 80. The connection structure shown in FIG. 4 may be used for all of the leads 50, 52 on the memory module 10 except for the chip select leads. Thus, the through-the-board connection shown in FIG. 4 may be used to connect all common read, write and addressing leads.

Figure 5:
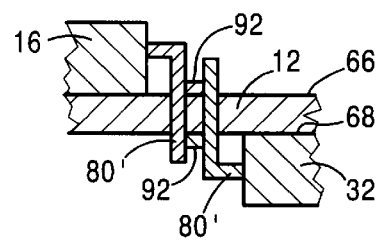
FIG. 5 is a partial cross section view, like FIG. 4, showing another embodiment of the invention.

In an alternative embodiment, shown in FIG. 5, leads 80' extend entirely through the printed circuit board 12. Solder paste 92 is applied on the top and/or bottom sides 66, 68 of the board 12 to provide the desired electric connection between the like leads 80'.

Figure 6:
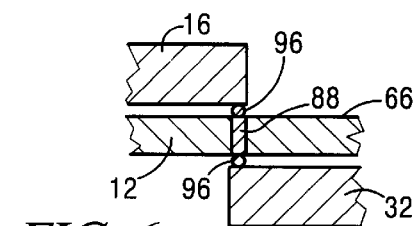
FIG. 6 is a partial cross section view, like FIG. 4, showing yet another embodiment of the invention.

In yet another embodiment of the invention, shown in FIG. 6, the chips 16–46 are supported on fine ball grid arrays (FBGA) 96. Solder balls 96 are provided on opposite sides of an opening 88 that is filled with conductive material. The solder balls 96 serve as leads for connecting the chips 16–46 to the traces 54 on the printed circuit board 12. The conductive material in the opening 88 provides electrical conductivity between balls 96 representing common positions on the chips 16–46.

The present invention may be employed with a wide variety of semiconductor devices, including dynamic random access memory (DRAM) devices) static random access memory (SRAM) devices, read only memory (ROM) devices, gate arrays, etc.

The above descriptions and drawings are only illustrative of preferred embodiments which achieve the features and advantages of the present invention, and it is not intended that the present invention be limited thereto. Any modification of the present invention which comes within the spirit and scope of the following claims is considered part of the present invention.

What is claimed as new and desired to be protected by letters patent of the United States is:

1. A semiconductor device system, comprising:
   a supporting member having a first side and a second side;
   first semiconductor devices located on said first side of said supporting member; and
   second semiconductor devices located on said second side of said supporting member, said second semiconductor devices being staggered with respect to said first semiconductor devices, said second semiconductor devices being electrically connected to said first semiconductor devices by conductors passing through said support member.

2. The system of claim 1, wherein said supporting member includes a printed circuit board.

3. The system of claim 2, wherein said supporting member includes an edge connector, said edge connector being electrically connected to said first and second semiconductor devices.

4. The system of claim 3, wherein said first and second semiconductor devices include memory chips.

5. The system of claim 4, further comprising conductive traces on said printed circuit board, said traces being electrically connected to said memory chips and said edge connector.

6. A board mounted memory module, comprising:
   a board member having top and bottom sides and an edge connector;
   first semiconductor memory devices located on said top side of said board member, said memory devices having leads, said leads being connected to said edge connector; and
   second semiconductor memory devices located on said bottom side of said board member, said second semiconductor memory devices being located between said first semiconductor memory devices, said second semiconductor memory devices having leads connected to said edge connector, and wherein said leads of said first semiconductor memory devices are substantially aligned through said board member with said leads of said second semiconductor memory devices.

7. The memory module of claim 6, wherein said board member has openings aligned with said leads of said first and second semiconductor memory devices.

8. The memory module of claim 7, wherein said leads of said first and second semiconductor memory devices extend through said openings, and wherein conductive material on said board member connects said leads of said first semiconductor memory devices to said leads of said second semiconductor memory devices.

9. The memory module of claim 8, further comprising electrically conductive traces on said board member, said traces being connected to said first and second semiconductor memory devices and said edge connector.

10. An electrically connected system of semiconductor devices, said system comprising:
    first semiconductor devices having leads and provided on a first side of a support member; and
    second semiconductor devices having leads, said second semiconductor devices being substantially identical to said first semiconductor devices, said second semiconductor devices being provided on a second opposite side of said support member and staggered between said first semiconductor devices, and said leads of said second semiconductor devices being substantially aligned with said leads of said first semiconductor devices.

11. The system of claim 10, further comprising an elongated mounting board between said first and second semiconductor devices.

12. The system of claim 11, further comprising an edge connector for connection to a computer.

13. A memory system, comprising:
    a computer mother board;

an elongated printed circuit board;

semiconductor memory devices mounted in a staggered formation on opposite sides of said printed circuit board, said devices being connected to each other through said printed circuit board; and a connector for connecting said memory devices to said computer mother board.

14. The memory system of claim 13, wherein said memory devices include dynamic random access memory devices.

15. The memory system of claim 13, wherein said memory devices include static random access memory devices.

16. The memory system of claim 13, wherein said memory devices include read only memory devices.

17. A method of making a dual in-line memory module, said method comprising the steps of:

mounting first memory devices on a top side of a board;

connecting said memory devices to an edge connector;

mounting second memory devices to a bottom side of said board in a staggered pattern, such that said second memory devices are located between said first memory devices; and aligning said first and second memory devices such that electrical connections from said first memory devices are located directly above like electrical connections from said second memory devices.

18. The method of claim 17, wherein said step of mounting said first memory devices on said board includes the step of extending leads from said first memory devices through said board.

19. The method of claim 17, wherein said steps of mounting said first and second memory devices include the step of aligning ball grid arrays on said sides of said board.

20. The method of claim 17, wherein said step of connecting said first memory devices to said edge connector includes the steps of connecting conductive traces to said first memory devices and connecting said conductive traces to said edge connector.

* * * * *